(12) United States Patent
Kameda

(10) Patent No.: US 6,653,720 B2
(45) Date of Patent: Nov. 25, 2003

(54) SEMICONDUCTOR ELECTRONIC PARTS

(75) Inventor: Yutaka Kameda, Yukuhashi (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/174,111

(22) Filed: Jun. 18, 2002

(65) Prior Publication Data
US 2002/0195703 A1 Dec. 26, 2002

(30) Foreign Application Priority Data
Jun. 21, 2001 (JP) ........................................ 2001-187579

(51) Int. Cl.⁷ ............................................... H01L 23/12
(52) U.S. Cl. ...................................................... 257/667
(58) Field of Search ........................................ 257/667

(56) References Cited

U.S. PATENT DOCUMENTS

| | | | | |
|---|---|---|---|---|
| 5,278,446 A | * | 1/1994 | Nagaraj et al. | 257/707 |
| 5,729,050 A | * | 3/1998 | Kim | 257/667 |
| 6,239,480 B1 | * | 5/2001 | MacPherson et al. | 257/676 |
| 6,391,682 B1 | * | 5/2002 | Tsai et al. | 438/108 |

FOREIGN PATENT DOCUMENTS

JP 02238999 A * 9/1990 ........... B42D/15/10

* cited by examiner

Primary Examiner—Allan R. Wilson
(74) Attorney, Agent, or Firm—Jordan and Hamburg LLP

(57) ABSTRACT

Semiconductor electronic parts 1 comprises electrode pads 7 formed on the surface of a base 2 and adapted to be connected to respective electrode terminals 4 and a bare chip 3 adhesive bonded to the surface of the base 2, wherein adhesive flow-in preventing means 12 is provided between the bare chip 3 and each of the electrode pad 7 for preventing the adhesive 10 for adhesive bonding the bare chip 3 to the base 2 from flowing in the electrode pads 7. Therefore, in an underfill process of adhesive bonding the base 2 to the bare chip 3 placed on the upper part thereof and sealing a gap between both of them with the adhesive 10 during manufacturing semiconductor electronic parts, the adhesive 10 is prevented from flowing out of the outside edge of the bare chip 3 and from depositing on the electrode pads 7 formed on the base 2.

13 Claims, 6 Drawing Sheets

SEMICONDUCTOR ELECTRONIC PARTS

BACKGROUND OF THE INVENTION

1. Field of the Invention

The present invention relates to semiconductor electronic parts.

2. Description of Related Arts

Conventional semiconductor electronic parts has involved adhesive bonding a bare chip to the upper part of an island formed at an approximately central portion of a lead frame, connecting electrode pads formed on the bare chip to respective lead terminals (electrode terminals) formed at the peripheral edge of the lead frame via gold wires with wire bonding, and sealing the bare chip with a resin.

When the conventional semiconductor electronic parts having one bare chip placed on the upper part of the island of the lead frame and the plurality of lead terminals arranged around the bare chip were mounted on a printed wiring board, an area occupied by the semiconductor electronic parts was larger on the printed wiring board which caused hindrance in reducing the size of electronic equipment.

In these years, to achieve a high-density construction, so-called chip-on-chip type semiconductor electronic parts have been developed in which another bare chip is adhesive bonded to the upper part of the bare chip, the upper bare chip is connected to the lower bare chip with die-bonding, the electrode pads formed on the lower bare chip are connected to the respective lead terminals (the electrode terminals) via the gold wires with wire bonding and then both bare chips are sealed with a resin.

In the process of manufacturing the chip-on-chip type semiconductor electronic parts, during adhesive bonding the upper bare chip to the upper part of the lower bare chip, bumps formed on the upper face of the lower bare chip and bumps formed on the lower face of the upper bare chip were connected together with die-bonding (a die-bonding process) and then an adhesive was injected into a gap formed between both bare chips by a dispenser (an underfill process). The upper and lower bare chips were thereby adhesive bonded to each other.

The developed semiconductor electronic parts having a high-density construction included a flip-chip mounting, where the bare chip was connected to the printed wiring board with die-bonding and the adhesive is injected into the gap formed between the bare chip and the printed wiring board (an underfill process) and the bare chip was sealed with the resin, and a chip-size package (CSP), where the bare chip was adhesive bonded to a film (an underfill process), the electrode pads on the film were connected to the respective electrode pads on the bare chip via inner wires and then the electrode pads on the film were connected to the respective electrode pads on the printed wiring board via outer wires.

Concerning the conventional semiconductor electronic parts, described above, in the underfill process of bonding the bare chip to the upper part of the base (the bare chip, the printed wiring board, the film or others) with the adhesive and sealing the gap formed between the upper face of the base and the lower face of the bare chip, a less amount of adhesive to be injected has produced bubbles inside without completely sealing the gap between the base and the bare chip. The bubbles might have been thermally expanded in a soldering process to give damage to the bare chip. Therefore, a sufficient amount of adhesive should have been injected between the base and the bare chip.

If a larger amount of adhesive, than a proper amount, has been injected between the base and the bare chip so that a sufficient amount of adhesive can be injected therebetween in the underfill process, the adhesive injected between the base and the bare chip has overflowed to the outside of the bare chip and the overflowing adhesive has flowed into the upper parts of the electrode pads formed on the upper face of the base, with the result that the electrode pads might have been covered with the adhesive.

The deposition of the adhesive on the electrode pads in the underfill process might have precluded the bonding of the wires to the electrode pads in the following wire bonding process of connecting the electrode pads to the respective electrode terminals with the wires or might have caused poor continuity between the electrode pad and the wire.

SUMMARY OF THE INVENTION

According to one aspect of the present invention, semiconductor electronic parts comprise a plurality of electrode pads formed on the surface of a base and adapted to be connected to respective electrode terminals and a bare chip adhesive bonded to the surface of the base, wherein adhesive flow-in preventing means is provided between the bare chip and each of the electrode pads for preventing an adhesive for adhesive bonding the bare chip to the base from flowing into the electrode pads.

According to another aspect of the present invention, the adhesive flow-in preventing means is a peripheral wall so formed on the surface of the base as to encircle the bare chip.

According to another aspect of the present invention, an inlet for injection of the adhesive is formed in the peripheral wall.

According to another aspect of the present invention, a plurality of grooves are formed in the surface of the base or in the reverse of the bare chip for admitting the adhesive.

According to another aspect of the present invention, a chip-on-chip arrangement is constructed by forming the base with the bare chip.

DISCLOSURE OF THE INVENTION

Figure 1:
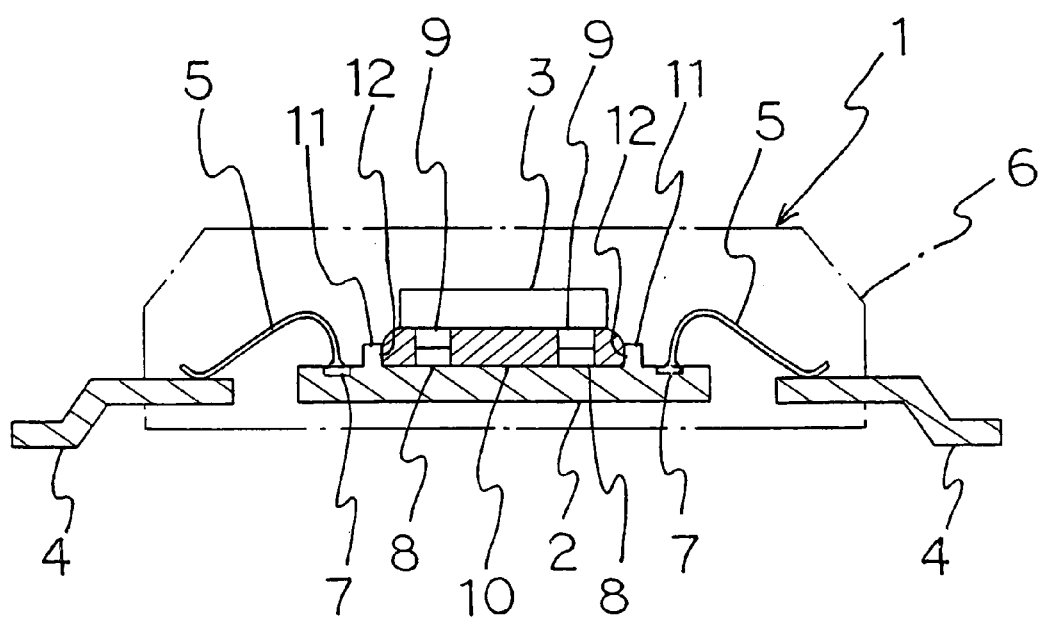
FIG. 1 is a sectional view showing semiconductor electronic parts according to the invention.

The semiconductor electronic parts according to the invention have the electrode pads formed on the surface of the base and adapted to be connected to the respective electrode terminals and the bare chip adhesive bonded to the surface of the base. The semiconductor electronic parts in such construction are represented by the chip-on-chip type semiconductor electronic parts using the bare chip as the base on which another bare chip is laminated, but not limited thereto. For example, they include a flip chip mounting using a printed wiring board as the base, on the upper part of which the bare chip is placed, and a chip size package (CSP) which is almost the same as the chip in size and which is mountable on the printed wiring board.

Still, according to the present invention, the adhesive flow-in preventing means is provided between the bare chip and each of the electrode pads for preventing the adhesive for adhesive bonding the bare chip to the base from flowing in the electrode pads.

Therefore, in the underfill process of bonding the bare chip to the base with the adhesive and sealing a gap formed between the lower face of the bare chip and the upper face of the base with the adhesive, the adhesive injected between the bare chip and the base, if overflowing to the outside of the bare chip, can be blocked by the adhesive flow-in preventing means and the adhesive can be prevented from flowing in the electrode pads and depositing on the surfaces of the electrode pads.

Since the adhesive is prevented from depositing on the electrode pads, incomplete connection or poor continuity between the electrode pad and the wire or the electronic parts is prevented during bonding the wires to the electrode pads or soldering electronic parts including chip resistors or chip capacitors to the electrode pads and the reliability of the semiconductor electronic parts is improved.

Particularly, if the peripheral wall as the adhesive flow-in preventing means is so formed on the surface of the base as to encircle the bare chip, the adhesive flow-in preventing means can be easily and inexpensively formed on the surface of the base, offering simple construction for preventing the adhesive from depositing on the electrode pads.

If the inlet for injection of the adhesive is formed in the peripheral wall, easy injection work for the adhesive is achieved by injecting the adhesive through the inlet, the need for injection work for the adhesive in other areas than the inlet is eliminated, and a smaller space between the bare chip and the peripheral wall is required. Therefore, the peripheral wall can be formed the closest possible to the periphery of the bare chip and the area of the base can be reduced with the electrode pads arranged close to the peripheral wall, resulting in a reduction in the size of the semiconductor electronic parts.

If the grooves are formed in the surface of the base or in the reverse of the bare chip for admitting the adhesive, the adhesive can flow between the base and the bare chip along the grooves, thus smoothing injection work for the adhesive in a short time and improving injection working efficiency for the adhesive.

If the chip-on-chip arrangement is constructed by forming the base with bare chip, the high-density (highly integrated) construction of the semiconductor electronic parts is accomplished.

DETAILED DESCRIPTION OF PREFERRED EMBODIMENTS

Referring to the drawings, more specific embodiments are detailed.

In Embodiment 1, as shown in FIG. 1, semiconductor electronic parts 1 according to the invention are constructed by placing on an approximately central portion of a bare chip 2 as a rectangular flat base, another rectangular flat bare chip 3, arranging a plurality of lead terminals 3 as electrode terminals in spaced relation, as predetermined, around the bare chip 2 at the lower side, electrically connecting the bare chip 3 at the upper side to the bare chip 2 at the lower side with die-bonding, electrically connecting the bare chip 2 at the lower side to the lead terminals 4 via wires 5 (gold wires) with wire bonding, and further sealing both bare chips 2, 3 and the wires 5 with a resin 6, that is, the semiconductor electronic parts 1 is constructed in chip-on-chip arrangement with two bare chips 2, 3 laminated. Thus, the high-density (highly integrated) construction of the semiconductor electronic parts is accomplished by adopting the chip-on-chip arrangement. It is acceptable that the bare chip 2 at the lower side is placed on the upper part of an island of a lead frame.

Figure 2:
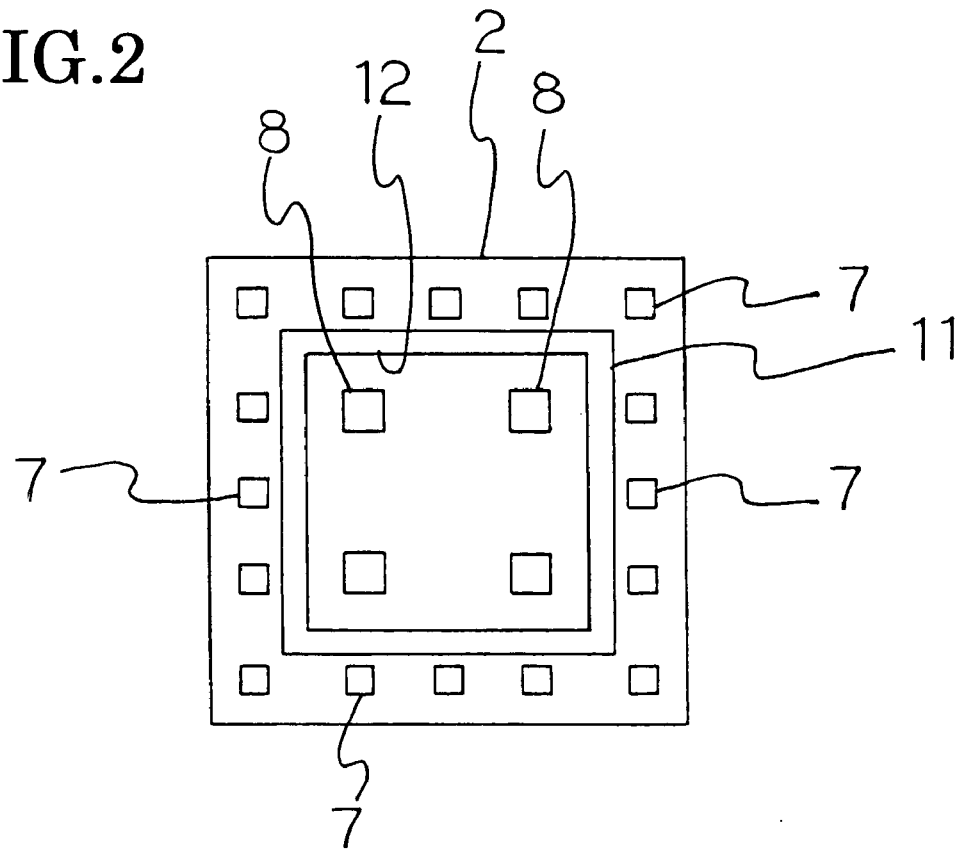
FIG. 2 is a plan view showing a base in Embodiment 1.
Figure 3:
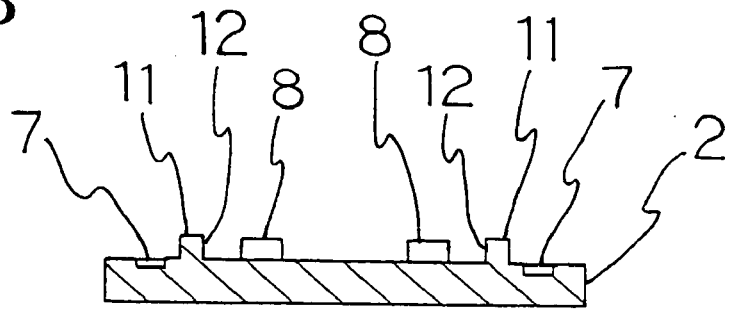
FIG. 3 is a sectional side view showing the same.

The lower bare chip 2, as shown in FIG. 1 and FIG. 2, has a plurality of square electrode pads 7 formed in spaced relation, as predetermined, at the peripheral edge of the surface (the upper face) thereof and four bumps 8 formed at the side of an approximately central portion of the surface (the upper face) thereof. The bumps 8 are connected to respective bumps 9 formed at four corners of the reverse (the lower face) of the upper chip 3 with die-bonding.

The surface of the lower bare chip 2 as the base is provided with adhesive flow-in preventing means located between the outside edge of the upper bare chip 3 and each of the electrode pads 7 for preventing an adhesive 10 for adhesive bonding the upper and lower bare chips 2, 3 to each other from flowing in the electrode pads 7 and from depositing on the surfaces of the electrode pads 7.

The adhesive flow-in preventing means is constructed with a rectangular wall body 11 protruded along the outside edge of the upper bare chip 3 on the surface of the lower bare chip 2 and an uprising peripheral wall 12 constituting the inner peripheral face of the wall body 11 for preventing the adhesive 10 from flowing out of the outside edge of the upper bare chip 3 toward the electrode pads 7 and thereby preventing the adhesive 10 from flowing into the electrode pads 7.

The peripheral wall 12 is so formed as to encircle the upper bare chip 3. Therefore, the adhesive 10 overflowing out of the outside edge of the upper bare chip 3 is precluded from flowing out toward the electrode pads 7 in any directions. The semiconductor electronic parts according to the invention, constructed as described above, are manufactured as described below.

First, the upper bare chip 3 is placed on the upper part of the lower bare chip 2 as the base. At this time, the bumps 8 formed on the upper face of the lower bare chip 2 are connected to the bumps 9 formed on the lower face of the upper bare chip 3 with die-bonding (a die-bonding process). Thus, a gap equivalent to the heights of the bumps 8, 9 subjected to die-bonding can be formed between the upper face of the lower bare chip 2 and the lower face of the upper bare chip 3.

Figure 4:
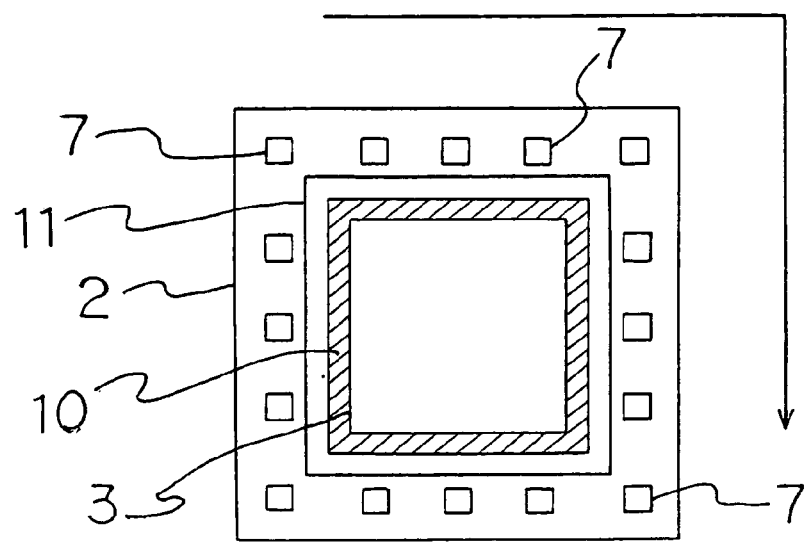
FIG. 4 is an explanatory plan view showing an underfill process.
Figure 5:
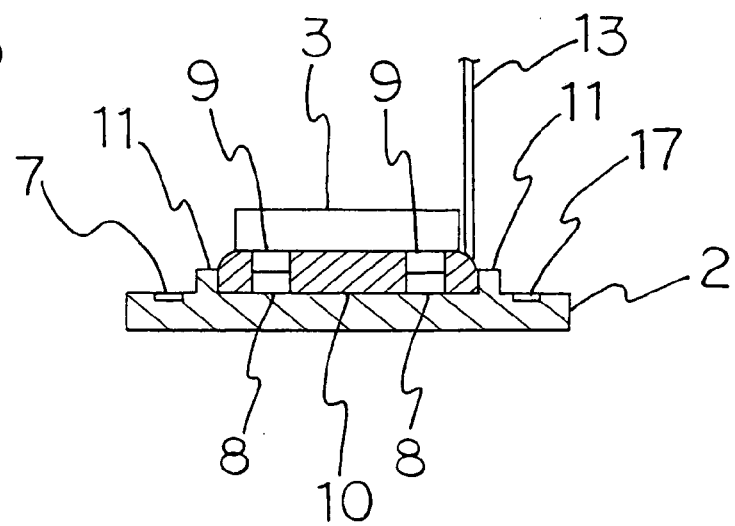
FIG. 5 is an explanatory sectional view showing the same.

Secondly, as shown in FIG. 4 and FIG. 5, while a nozzle 13 of a dispenser, not illustrated, for applying the adhesive is made to travel between the upper bare chip 3 and the peripheral wall 12 in a plan view, the adhesive 10 is injected from the end of the nozzle 13 between the upper bare chip 3 and the peripheral wall 12 (an underfill process). In this embodiment, as shown in FIG. 4, the dispenser (the nozzle 13) is made to travel from the left-side rear part to the right-side rear part of the upper bare chip and then to travel from the right-side rear part to the right-side front part of the upper bare chip 3 when injecting the adhesive 10 from two sides, the rear side and the right side, of the upper bare chip 3. The injecting method for the adhesive 10 is properly changeable depending on the size of the bare chip 3. It is acceptable that the adhesive 10 is injected from one side, for example, from the rear side of the upper bare chip 3 while making the dispenser (the nozzle 13) travel simply from the left-side rear part to the right-side rear part of the upper bare chip 3, instead that the adhesive 10 is injected from two sides of the bare chip 3 in this embodiment. It is also acceptable that the adhesive 10 is injected from one point without making the dispenser (the nozzle 13) travel.

As the adhesive 10 is injected into the outside edge of the upper bare chip 3, the adhesive 10 is injected into the gap formed between the upper face of the lower bare chip 2 and the lower face of the upper bare chip 3, with the result that the gap is filled with the adhesive 10 and sealed with the adhesive 10. In the state that the gap formed between the upper face of the lower bare chip 2 and the lower face of the upper bare chip 3 is filled with the adhesive 10, the adhesive 10 is further injected therein, whereupon the adhesive 10 overflows from the outside edge of the upper bare chip 3 and the adhesive 10 flows out toward the electrode pads 7 located at the outside of the bare chip 3.

However, if the adhesive 10 flows out of the outside edge of the upper bare chip 3 toward the electrode pads 7, the flowing-out adhesive 10 is blocked by the peripheral wall 12 as the adhesive flow-in preventing means, therefore eliminating the possibility of the flow of the adhesive 10 into the electrode pads 7 and the deposition of the adhesive on the surface of the electrode pads 7.

Thirdly, the electrode pads 7 formed on the lower bare chip 2 are connected to the base ends of the respective lead terminals 4 via the wires 5 (the gold wires) with wire bonding (a wire bonding process).

Lastly, the upper and lower bare chips 2, 3 and the wires 5 are sealed with the resin 6 (a resin sealing process). The semiconductor electronic parts 1 in this embodiment have the adhesive flow-in preventing means provided between the upper bare chip 3 and each of the electrode pads 7 for preventing the adhesive 10 for adhesive bonding the upper bare chip 3 to the lower bare chip 2 (the base) from flowing into the electrode pads 7, whereby, in the underfill process of bonding the upper bare chip 3 to the lower bare chip 2 (the base) with the adhesive 10 and sealing the gap formed between the lower face of the upper bare chip 3 and the upper face of the lower bare chip 2 (the base) with the adhesive 10, the adhesive 10 injected between the upper bare chip 3 and the lower bare chip 2 (the base), if overflowing to the outside of the upper bare chip 3, is blocked and so the adhesive 10 is prevented from flowing into the electrode pads 7 and from depositing on the surface of the electrode pads 7.

Therefore, during boding the wires 5 to the electrode pads 7, incomplete connection (lacking bonding strength) or poor continuity (excessive electric resistance) between each of the electrode pads 7 and each of the wires 5 is avoided and the reliability of the semiconductor electronic pats 1 is improved. Besides, the adhesive flow-in preventing means in this embodiment, which is constructed with the peripheral wall 12 so formed on the upper face (the surface) of the lower bare chip 2 (the base) as to encircle the upper bare chip 3, can be easily and inexpensively formed on the surface of the lower bare chip 2 (the base), offering simple construction for preventing the adhesive 10 from depositing on the electrode pads 7.

In this embodiment, the peripheral wall 12 as the adhesive flow-in preventing means is formed with the wall body 11 protruded on the upper face of the lower bare chip 2. However, the peripheral wall 12 as the adhesive flow-in preventing means is not limited to such formation and is adaptable if so formed as to encircle the upper bare chip 3, as shown in FIG. 6 and FIG. 7.

Figure 6:
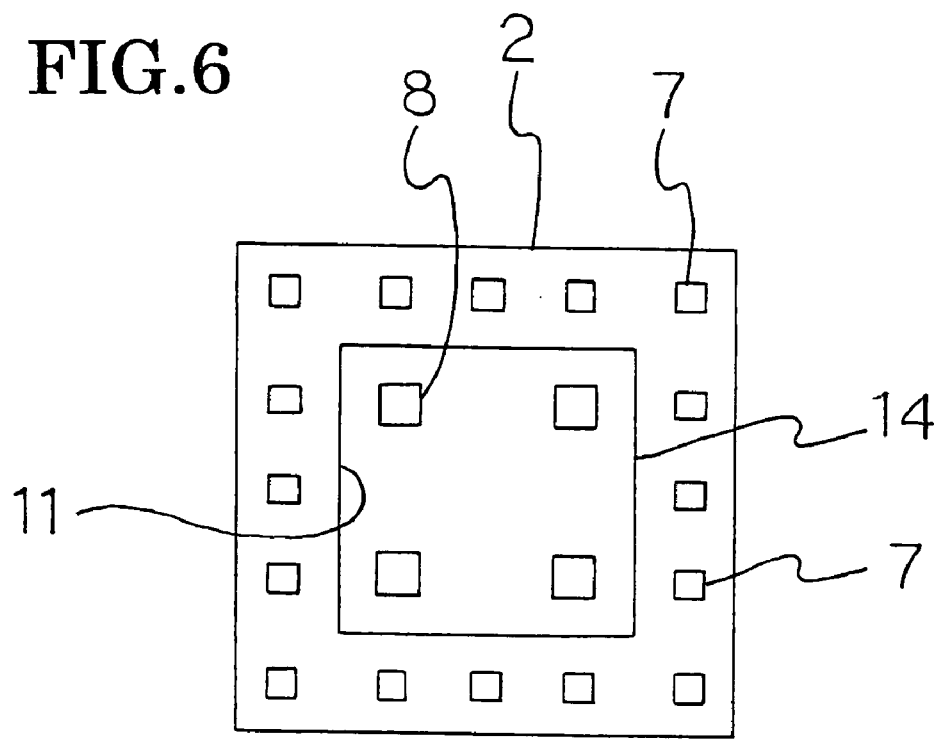
FIG. 6 is a plan view showing the base in Embodiment 2.
Figure 7:
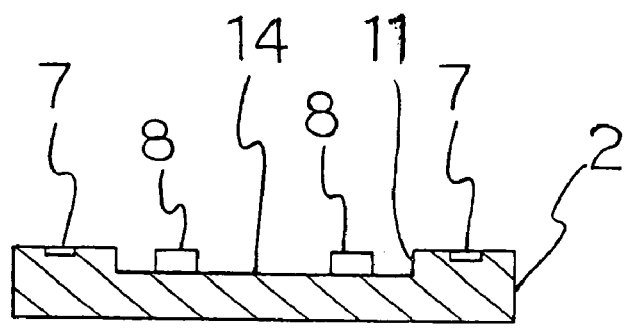
FIG. 7 is a sectional side view showing the same.

Namely, FIG. 6 and FIG. 7 show the base in Embodiment 2. In this embodiment, the bare chip 2 is also used as the base, likewise in Embodiment 1. For ease of understanding, functioning components in the following embodiments, similar to those of the semiconductor electronic parts 1 shown in Embodiment 1, are stated using the same names and numerals.

In Embodiment 2, a recessed portion 14 depressed lower than the electrode pads 7 is formed at an approximately central portion of the lower bare chip 2 as the base and the bumps 8 are formed on the recessed portion 14, while the electrode pads 7 are formed outside the recessed portion 14. The peripheral wall 12 as the adhesive flow-in preventing means is formed at the peripheral edge of the recessed portion 14.

As described above, in some case, the dispenser (the nozzle 13) is fixed and the adhesive 10 is injected from one point. In this case, an inlet 15 for injection of the adhesive can be formed in the peripheral wall 12, as shown in FIG. 8.

Figure 8:
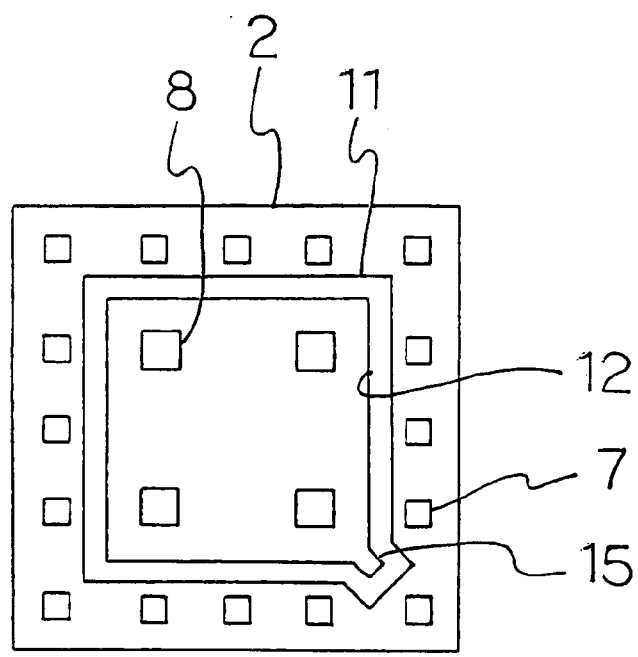
FIG. 8 is a plan view showing the base in Embodiment 3.

Namely, FIG. 8 shows the base in Embodiment 3. In this embodiment, the rectangularly framed wall body 11 is protruded on the upper face of the lower bare chip 2 as the base and the peripheral wall 12 is formed on the inner peripheral face thereof, likewise in Embodiment 1. Furthermore, the inlet 15 for injection of the adhesive 10 is formed in the peripheral wall 12 by protruding an angular portion at the right-side front part of the wall body 11 to the outside. In the underfill process for manufacturing the semiconductor electronic parts 1, as described above, the end of the dispenser (the nozzle 13) is inserted into the inlet 15 through which the adhesive 10 is injected.

In the embodiment, since the inlet 15 for injection of the adhesive is formed in the peripheral wall 12, easy injection work for the adhesive 10 is achieved by injecting the adhesive through the inlet 15.

Additionally, the need for injection work for the adhesive 10 in other areas than the inlet 15 is eliminated, and so a space between the upper bare chip 3 and the peripheral wall 12 can be narrowed in a plan view, the peripheral wall 12 can be formed the closest possible to the periphery of the upper bare chip 3, and the area of the lower bare chip 2 (the base) can be reduced with the electrode pads 7 arranged close to the peripheral wall 12, resulting in a reduction in the size of the semiconductor electronic parts 1.

Figure 9:
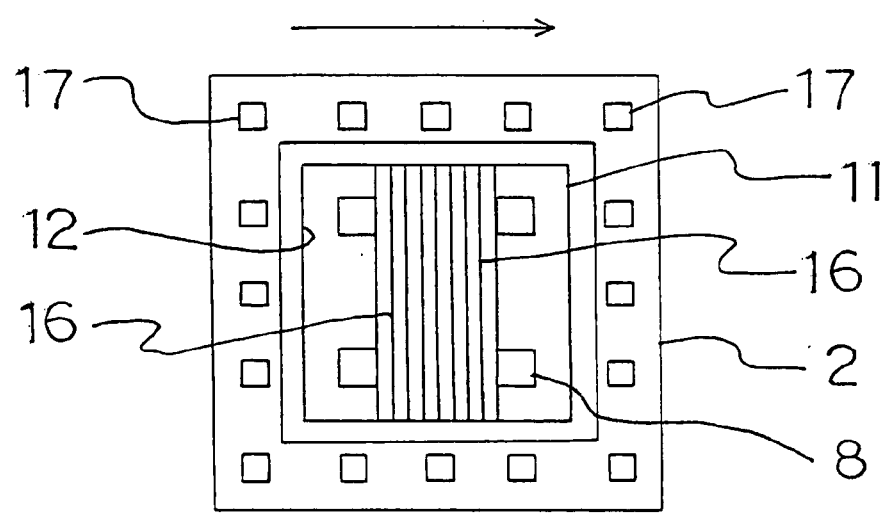
FIG. 9 is a plane view showing the base in Embodiment 4.
Figure 10:
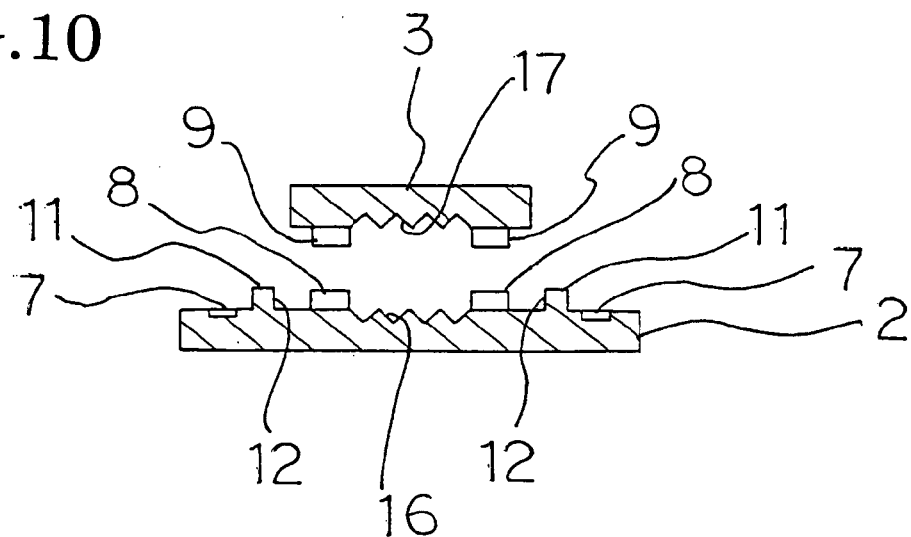
FIG. 10 is a sectional side view showing the same.
Figure 11:
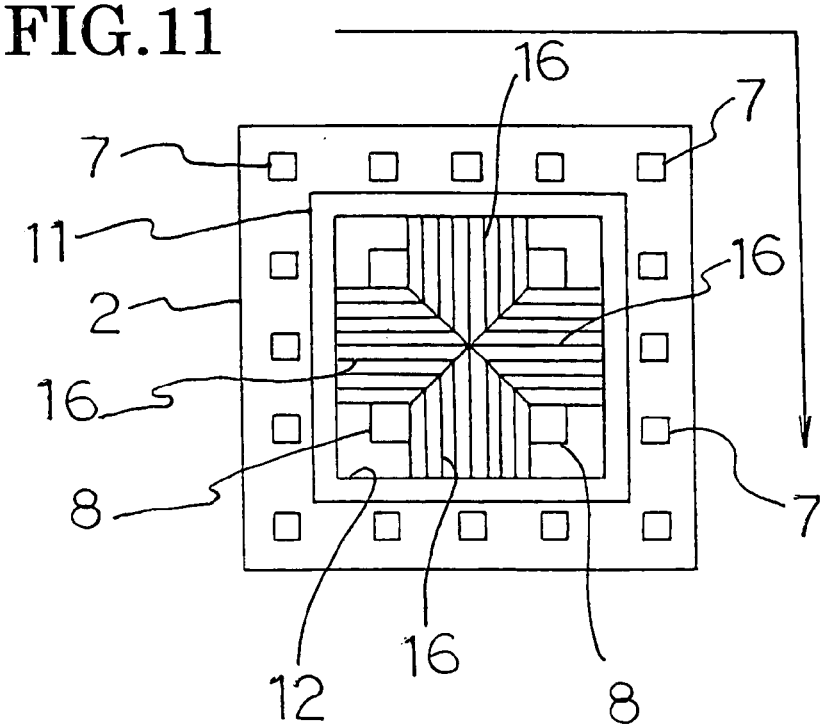
FIG. 11 is a plan view showing the base in Embodiment 5.

For the purpose of smooth flow of the adhesive 10 when the adhesive 10 is injected into the gap between the upper face of the lower bare chip 2 (the base) and the lower face of the upper bare chip 3 in the underfill process, grooves 16, 17 can be formed in the upper face (the surface) of the lower bare chip 2 (the base) and in the lower face (the reverse) of the upper bare chip 3, respectively, for admitting the adhesive 10, as shown in FIG. 9 to FIG. 11.

Namely, FIG. 9 and FIG. 10 show the lower bare chip 2 (the base) and the upper bare chip 3 in Embodiment 4. The lower bare chip 2 as the base has the plurality of linear grooves 16 provided in the inside portion of the upper face beyond the peripheral wall 12 extending to the longitudinal direction while the lower bare chip 3 has the plurality of linear grooves 17 provided in the lower face extending to the longitudinal direction, as shown in FIG. 9 and FIG. 10.

In the underfill process, the adhesive 10 is injected while making the dispenser (the nozzle 13) travel from the left-side rear part to the right-side rear part of the upper bare chip 3, whereupon the injected adhesive 10 flows along the grooves 16, 17 and the gap between the upper and lower bare chips 2, 3 is filled with the adhesive 10 all over the lower face of the upper bare chip 3.

FIG. 11 shows the lower bare chip 2 (the base) in Embodiment 5. In this embodiment, the plurality of linear grooves 16 are provided in an inside portion of the upper face of the lower bare chip 2 as the base beyond the peripheral wall 12 extending to the longitudinal and cross directions.

In the underfill process, the adhesive 10 is injected while making the dispenser (the nozzle 13) travel from the left-side rear part to the right-side rear part of the upper bare chip 3 and further travel from the right-side rear part to the right-side front part of the upper bare chip 3, whereupon the injected adhesive 10 flows along the longitudinal and cross grooves 16 and the gap between the upper and lower bare chips 2, 3 is filled with the adhesive 10 all over the lower face of the upper bare chip 3.

In this embodiment, since the grooves 16, 17 are formed in the upper face (the surface) of the lower bare chip 2 (the base) and/or in the lower face (the reverse) of the upper bare chip 3 for admitting the adhesive 10, the adhesive 10 can flow along the groves 16, 17 between the lower bare chip 2 (the base) and the upper bare chip 3, thus smoothing injection work for the adhesive 10 in a short time and improving injection working efficiency for the adhesive 10. It is acceptable that the grooves 16, 17, although formed in the upper face (the surface) of the lower bare chip 2 (the base) or in the lower face (the reverse) of the upper bare chip 3, are formed all over the upper face (the surface) of the lower bare chip 2 (the base) or the lower face (the reverse) of the upper bare chip 3.

EFFECTS OF THE INVENTION

This invention, embodied in configurations as described above, has the following effects.

In one aspect of the present invention, the semiconductor electronic parts comprise the plurality of electrode pads formed on the surface of the base and adapted to be connected to the respective electrode terminals and the bare chip adhesive bonded to the surface of the base, wherein the adhesive flow-in preventing means is provided between the bare chip and each of the electrode pads for preventing an adhesive for adhesive bonding the bare chip to the base from flowing into the electrode pads. Accordingly, in the underfill process of bonding the bare chip to the base with the adhesive and sealing the gap formed between the lower face of the bare chip and the upper face of the base with the adhesive, the adhesive injected between the bare chip and the base, if overflowing to the outside of the bare chip can be blocked by the adhesive flow-in preventing means and the adhesive can be prevented from flowing in the electrode pads and from depositing on the surface of the electrode pads.

Therefore, incomplete connection or poor continuity between the electrode pad and the wire or the electronic parts is prevented during bonding the wires to the electrode pads or soldering the electronic parts including chip resistors or chip capacitors to the electrode pads and the reliability of the semiconductor electronic parts is improved.

In another aspect of the present invention, the adhesive flow-in preventing means is the peripheral wall so formed on the surface of the base as to encircle the bare chip. Accordingly, the adhesive flow-in preventing means can be easily and inexpensively formed on the surface of the base, offering simple construction for preventing the adhesive from depositing on the electrode pads.

Still, since the bare chip is encircled by the peripheral wall, the adhesive, if overflowing out of the outside edge of the bare chip in any directions, can be blocked by the peripheral wall and the adhesive can be preventing from depositing on the electrode pads.

In another aspect of the present invention, the inlet for injection of the adhesive is formed in the peripheral wall. Accordingly, easy injection work for the adhesive is achieved by injecting the adhesive through the inlet.

Still, the need for injection work for the adhesive in other areas than the inlet is eliminated and a smaller space between the bare chip and the peripheral wall is required, and so the peripheral wall can be formed the closest possible to the periphery of the bare chip and the area of the base can be reduced with the electrode pads arranged close to the peripheral wall, resulting in a reduction in the size of the semiconductor electronic parts.

In another aspect of the present invention, the grooves are formed in the surface of the base or in the reverse of the bare chip for admitting the adhesive. Accordingly, the adhesive can flow between the base and the bare chip along the grooves, smoothing the injection work for the adhesive in a short time and improving injection working efficiency for the adhesive.

In another aspect of the prevent invention, the chip-on-chip arrangement is constructed by forming the base with the bare chip. Accordingly, the high-density (highly integrated) construction of the semiconductor electronic parts is accomplished.

What is claimed is:

1. A semiconductor electronic part, comprising:
 a plurality of electrode pads formed on a surface of a base and adapted to be connected to respective electrode terminals of a bare chip, and the bare chip bonded to the surface of the base with an adhesive, wherein an adhesive flow-in preventing means is provided between the bare chip and each of the electrode pads for preventing an adhesive for adhesive bonding the bare chip to the base from flowing into the electrode pads; the adhesive flow-in preventing means is a peripheral wall so formed on the surface of the base as to encircle the bare chip; and
 an inlet for injection of the adhesive is formed in the peripheral wall.

2. The semiconductor electronic part of claim 1, wherein a plurality of grooves are formed in the surface of the base or in the reverse of the bare chip for admitting the adhesive.

3. The semiconductor electronic part of claim 1, wherein a chip-on-chip arrangement is constructed by forming the base with the bare chip.

4. A chip-on-chip semiconductor electronic part comprising electrode pads disposed along an outer peripheral edge of a first bare chip on an upper surface of the first bare chip and a second bare chip is bonded inside the electrode pads with an adhesive,
 wherein a partition wall is disposed projecting between the second chip and the electrode pads on the upper surface of the first bare chip so as to encircle the second chip to prevent a flow of the adhesive into the electrode pad.

5. The chip-on-chip semiconductor electronic part of claim 4, wherein a plurality of grooves are formed on a surface of the first bare chip, the surface thereof being brought into contact with the adhesive.

6. The chip-on-chip semiconductor electronic part of claim 4, wherein a plurality of grooves are formed on a surface of the second bare chip, the surface thereof being brought into contact with the adhesive.

7. A semiconductor electronic part comprising:
   a base having a surface and plurality of electrode pads;
   said base having a flow preventing partition wall formed on said base;
   a bare chip bonded to the surface of the base with an adhesive;
   said flow preventing partition wall encompassing said bare chip; and
   said flow preventing partition wall including an inlet for injection of the adhesive.

8. The semiconductor electronic part according to claim 7, further comprising a plurality of grooves formed on the surface of the base.

9. The semiconductor electronic part according to claim 7, further comprising:
   said bare chip having a surface; and
   a plurality of grooves formed on the surface of the bare chip.

10. A chip-on-chip semiconductor electronic part comprising:
    a first bare chip having an upper surface with a peripheral edge and a plurality of electrode pads formed on the peripheral edge of the upper surface;
    a second bare chip bonded with an adhesive to the upper surface of the first bare chip and said bonding of the second bare chip being within the electrode pads;
    a partition wall formed of the upper surface of the first bare chip and being located between the electrode pads and the second bare chip so as to encircle the second bare chip and prevent a flow of the adhesive to the electrode pads.

11. A chip-on-chip semiconductor part according to claim 10, further comprising said partition wall including an inlet for injection of the adhesive.

12. The semiconductor electronic part according to claim 10, further comprising a plurality of grooves formed on the upper surface of the first bare chip.

13. The semiconductor electronic part according to claim 10, further comprising:
    said second bare chip having a surface; and
    a plurality of grooves formed on the surface of the second bare chip.

* * * * *